(12) United States Patent
Peng et al.

(10) Patent No.: US 8,658,065 B2
(45) Date of Patent: Feb. 25, 2014

(54) COLLOIDAL SEMICONDUCTOR NANOCRYSTALS HAVING 1-DIMENSIONAL QUANTUM CONFINEMENT AND METHODS OF MAKING THE SAME

(75) Inventors: Xiaogang Peng, Fayetteville, AR (US); Zheng Li, Fayetteville, AR (US)

(73) Assignee: The Board Of Trustees Of The University of Arkansas, Little Rock, AR (US)

( * ) Notice: Subject to any disclaimer, the term of this patent is extended or adjusted under 35 U.S.C. 154(b) by 31 days.

(21) Appl. No.: 13/346,130

(22) Filed: Jan. 9, 2012

(65) Prior Publication Data

US 2012/0175567 A1 Jul. 12, 2012

Related U.S. Application Data

(60) Provisional application No. 61/430,800, filed on Jan. 7, 2011.

(51) Int. Cl.
*H01B 1/12* (2006.01)

(52) U.S. Cl.
USPC .................................................. 252/519.34

(58) Field of Classification Search
USPC .................................................. 252/519.34
See application file for complete search history.

(56) References Cited

U.S. PATENT DOCUMENTS

2011/0248222 A1* 10/2011 Dubertret et al. .......... 252/519.4

FOREIGN PATENT DOCUMENTS

EP 2163301 A2 3/2010
WO 03050329 A2 6/2003

OTHER PUBLICATIONS

Qu, L., et al., "Alternative Routes toward High Quality CdSe Nanocrystals," Nano Letters, 2001, vol. 1, No. 6, p. 333-337.*
Chen, M., et al., "Synthesis of CdS nanoplates by PAA-assisted hydrothermal approach," Materials Letters 60 (2006) 3842-3845.*
International Search Report of International Appl. No. PCT/US2012/020620 dated Jun. 5, 2012, 5 pgs.
Chen et al, Synthesis of CdS nanoplates by PAA-assisted hydrothermal approach, Materials Letters, 2006, vol. 60, pp. 3842-3845, Elsevier B.V.
Liu et al, A facile solution route to CuS hexagonal nanoplatelets, Materials Chemistry and Physics, 2007, vol. 102, pp. 201-206, Elsevier B.V.
Zhong et al, Controlled synthesis of 3D nanostructured Cd4Cl3 (OH)5 templates and their transformation into Cd (OH)2 and CdS nanomaterials, Nanotechnology, 2006, vol. 17, pp. 772-777, IOP Publishing Ltd, UK.

* cited by examiner

*Primary Examiner* — Mark Kopec
*Assistant Examiner* — William Young
(74) *Attorney, Agent, or Firm* — J. Clinton Wimbish; Smith Moore Leatherwood LLP

(57) ABSTRACT

A nanocrystal described herein comprises a semiconductor material MX, wherein M is a group II or a group III element and X is a group V or a group VI element to provide a II/VI compound or a III/V compound, the nanocrystal having lateral dimensions and a vertical dimension having the shortest axis, wherein surfaces of the nanocrystal normal or substantially normal to the axis of the vertical dimension comprise a layer of M ions passivated by a counter ion chemical species.

31 Claims, 13 Drawing Sheets

(A) (B)

(C)

Scale Bar - 50 nm

COLLOIDAL SEMICONDUCTOR NANOCRYSTALS HAVING 1-DIMENSIONAL QUANTUM CONFINEMENT AND METHODS OF MAKING THE SAME

RELATED APPLICATION DATA

The present application claims priority under 35 U.S.C. §119(e) to U.S. Provisional Patent Application Ser. No. 61/430,800, filed Jan. 7, 2011, which is hereby incorporated by reference in its entirety.

FIELD

The present invention relates to colloidal semiconductor nanocrystals and, in particular, to two-dimensional colloidal semiconductor nanocrystals with one-dimensional quantum confinement.

BACKGROUND

Colloidal semiconductor nanocrystals continue to generate significant research and commercial interest due to their unique size dependent properties, flexible processing chemistry and applicability to a variety of industrial fields, including advanced optical materials.

Zero-dimensional and one-dimensional colloidal semiconductor nanocrystals, respectively known as colloidal quantum dots and quantum rods, have been successfully synthesized with good control of size, shape and size/shape distribution. However, effective synthesis of two-dimensional colloidal semiconductor nanocrystals with sufficient control of size, shape and size/shape distribution has proved to be increasingly difficult. Sheets and belts of semiconductors with at least one dimension in the bulk size regime and a thickness demonstrating one-dimensional quantum confinement have been reported. Nevertheless, the colloidal processability of such large structures is poor, leading to difficulties and inefficiencies in device fabrication.

SUMMARY

In view of the foregoing, two-dimensional colloidal semiconductor nanocrystals demonstrating one dimensional quantum confinement are provided herein. In some embodiments, a nanocrystal described herein comprises a semiconductor material MX, wherein M is a group II or a group III element and X is a group V or a group VI element to provide a II/VI compound or a III/V compound, the nanocrystal having lateral dimensions and a vertical dimension having the shortest axis, wherein surfaces of the nanocrystal normal or substantially normal to the axis of the vertical dimension comprise a layer of M ions passivated by counter ion chemical species. In some embodiments, surfaces normal or substantially normal to the axis of the vertical dimension are basal planes of the nanocrystal. In some embodiments, the vertical dimension of a nanocrystal described herein comprises a non-integer number of monolayers of the semiconductor material MX. Moreover, in some embodiments, the nanocrystal is colloidal in a continuous phase.

Groups II, III, V and VI, as used herein, refer to Groups IIB, IIIA, VA and VIA of the periodic table according to the American CAS designation. For example, Group IIB corresponds to the zinc family, Group IIIA corresponds to the boron family, Group VA corresponds to the nitrogen family and Group VIA corresponds to the chalcogens.

In another aspect, compositions comprising colloidal nanocrystals are provided herein. In some embodiments, a composition comprises colloidal nanocrystals comprising a semiconductor material MX, wherein M is a group II element or a group III element and X is a group V or a group VI element to provide a II/VI compound or a III/V compound, the nanocrystals having lateral dimensions and a vertical dimension having the shortest axis, wherein surfaces of the nanocrystals normal or substantially normal to the axis of the vertical dimension comprise a layer of M ions passivated by counter ion chemical species. In some embodiments, surfaces normal or substantially normal to the axis of the vertical dimension are basal planes of the nanocrystals. In some embodiments, the vertical dimension of the colloidal nanocrystals comprises a non-integer number of monolayers of the semiconductor material MX.

The colloidal semiconductor nanocrystals, in some embodiments, are monodisperse or substantially monodisperse in the vertical dimension. In some embodiments, the colloidal semiconductor nanocrystals are monodisperse or substantially monodisperse in at least one lateral dimension. In some embodiments, the colloidal semiconductor nanocrystals are monodisperse or substantially monodisperse in the vertical dimension and in one or more lateral dimensions. Additionally, in some embodiments, the colloidal semiconductor nanocrystals demonstrate any of the foregoing monodispersities without being subjected to size sorting procedure(s) to remove other nanocrystal discs.

In comprising lateral dimensions and a vertical dimension having the shortest axis, colloidal nanocrystals described herein, in some embodiments, have a disc shape. In some embodiments, for example, colloidal nanocrystals described herein have a square or rectangular disc shape. In some embodiments, colloidal nanocrystals of a composition demonstrate the same or substantially the same disc shape. The colloidal semiconductor nanocrystals, in some embodiments, can demonstrate the same or substantially the same shape without being subjected to shape sorting procedure(s).

Moreover, in some embodiments, nanocrystals described herein are photoluminescent. In some embodiments, photoluminescence from the nanocrystals results from the one-dimensional confinement of excitons. Exciton(s), as used herein, refer to bound electron-hole pairs as well as free or independent holes and electrons. Nanocrystals described herein, in some embodiments, demonstrate picosecond photoluminescent lifetimes.

In another aspect, methods of synthesizing colloidal semiconductor nanocrystals are provided. In some embodiments, a method of synthesizing colloidal semiconductor nanocrystals of the formula MX comprises adding to a reaction vessel a cation precursor (M) comprising a metal salt, adding to the reaction vessel one or more fatty acid species to provide a mixture comprising the cation precursor and the one or more fatty acid species, adding an anion precursor (X) to the reaction vessel and heating the mixture to a reaction temperature sufficient to form the colloidal semiconductor nanocrystals having lateral dimensions and a vertical dimension having the shortest axis, wherein surfaces of the nanocrystal normal or substantially normal to the axis of the vertical dimension comprise a layer of M ions passivated by counter ion chemical species. In some embodiments, surfaces normal or substantially normal to the axis of the vertical dimension are basal planes of the nanocrystals. In some embodiments, the vertical dimension of the colloidal nanocrystals comprises a non-integer number of monolayers of the semiconductor material MX. In some embodiments, MX comprises a II/VI compound or a III/V compound.

The anion precursor (X), in some embodiments, is added to the reaction vessel prior to the mixture reaching the reaction temperature. In some embodiments, for example, the anion precursor is added to the reaction vessel at room temperature. In some embodiments, the anion precursor is added to the reaction vessel once the mixture has reached or passed the reaction temperature.

In another aspect, a method of synthesizing colloidal semiconductor nanocrystals of the formula MX having a vertical dimension (z) in a first predetermined size range, a first lateral dimension (x) in a second predetermined size range and a second lateral dimension (y) in a third predetermined size range comprises adding to a reaction vessel a cation precursor (M) comprising a metal salt, adding to the reaction vessel one or more fatty acid species to provide a mixture comprising the cation precursor and the one or more fatty acid species, adding an anion precursor (X) to the reaction vessel and heating the mixture to a reaction temperature sufficient to provide the semiconductor nanocrystals (MX) the vertical dimension (z) in the first predetermined size range. The one or more fatty acid species is operable to stabilize the semiconductor nanocrystals at the reaction temperature, and the semiconductor nanocrystals are maintained at the reaction temperature for a time period sufficient to provide the semiconductor nanocrystals the first lateral dimension (x) in the second predetermined size range and the second lateral dimension (y) in the third predetermined size range, wherein the vertical dimension is the shortest dimension of the colloidal semiconductor nanocrystals. In some embodiments, the anion precursor (X) added to the reaction vessel prior to the mixture reaching the reaction temperature. Alternatively, in some embodiments, the anion precursor (X) is added to the reaction vessel once the mixture has reached or passed the reaction temperature.

In another aspect, methods of controlling one or more lateral dimensions of a colloidal semiconductor nanocrystal are provided. In some embodiments, a method of controlling one or more lateral dimensions of a colloidal semiconductor nanocrystal of the formula MX comprises adding to a reaction vessel a cation precursor (M) comprising a metal salt, varying the amount of one or more fatty acid species added to the reaction vessel to provide a mixture comprising the cation precursor and the one or more fatty acid species, adding an anion precursor (X) to the reaction vessel and heating the mixture to a reaction temperature sufficient to form the colloidal semiconductor nanocrystals. The anion precursor (X), in some embodiments, is added to the reaction vessel prior to the mixture reaching the reaction temperature. In some embodiments, the anion precursor (X) added to the reaction vessel once the mixture has reached or passed the reaction temperature. Additionally, varying the amount of one or more fatty acid species, in some embodiments, comprises increasing the amount of the one or more fatty acid species to decrease one or more lateral dimensions of the colloidal semiconductor nanocrystal.

In some embodiments, a method of controlling one or more lateral dimensions of a colloidal semiconductor nanocrystal of the formula MX comprises adding to a reaction vessel a cation precursor (M) comprising a metal salt, varying the hydrocarbon chain length of one or more fatty acid species added to the reaction vessel with the cation precursor to provide a mixture comprising the cation precursor and the one or more fatty acid species, adding an anion precursor (X) to the reaction vessel and heating the mixture to a reaction temperature sufficient to form the colloidal semiconductor nanocrystals. The anion precursor (X), in some embodiments, is added to the reaction vessel prior to the mixture reaching the reaction temperature. In some embodiments, the anion precursor added to the reaction vessel once the mixture has reached or passed the reaction temperature. Varying the hydrocarbon chain length of one or more fatty acid species, in some embodiments, comprises increasing the hydrocarbon chain length of the one or more fatty acid species to decrease one or more lateral dimensions of the colloidal semiconductor nanocrystal.

In some embodiments of methods described herein, the ratio of cation precursor (M) to anion precursor (X) in the mixture is greater than 2. In some embodiments, the ratio of cation precursor (M) to anion precursor (X) in the mixture is at least 2.5 or at least 3. In some embodiments, the ratio of cation precursor (M) to anion precursor (X) in the mixture is at least 4 or greater than 4. In some embodiment the ratio of cation precursor (M) to anion precursor (X) in the mixture is at least 5 or at least 6.

In some embodiments, methods described herein further comprise purifying the colloidal semiconductor nanocrystals. In some embodiments, purifying comprises combining the colloidal semiconductor nanocrystals with a mixture comprising one or more organophosphines and one or more alcohols to provide a purification mixture. In some embodiments, the purification mixture is sonicated.

Colloidal semiconductor nanocrystals produced and/or controlled according to methods described herein, in some embodiments, are monodisperse or substantially monodisperse in the vertical dimension. In some embodiments, the colloidal semiconductor nanocrystals are monodisperse or substantially monodisperse in at least one lateral dimension. In some embodiments, the colloidal semiconductor nanocrystals are monodisperse or substantially monodisperse in the vertical dimension and in one or more lateral dimensions. Additionally, in some embodiments, colloidal semiconductor nanocrystals produced according to methods described herein demonstrate any of the foregoing monodispersities without being subjected to size sorting procedure(s).

Colloidal semiconductor produced and/or controlled according to methods described herein, in some embodiments, have a disc shape. In some embodiments, for example, the colloidal nanocrystals have a square or rectangular disc shape. In some embodiments, the colloidal nanocrystals demonstrate the same or substantially the same disc shape. The colloidal semiconductor nanocrystals produced and/or controlled according to methods described herein, in some embodiments, can demonstrate the same or substantially the same shape without being subjected to shape sorting procedure(s).

These and other embodiments are described in further detail in the detailed description which follows.

DETAILED DESCRIPTION

Figure 1:
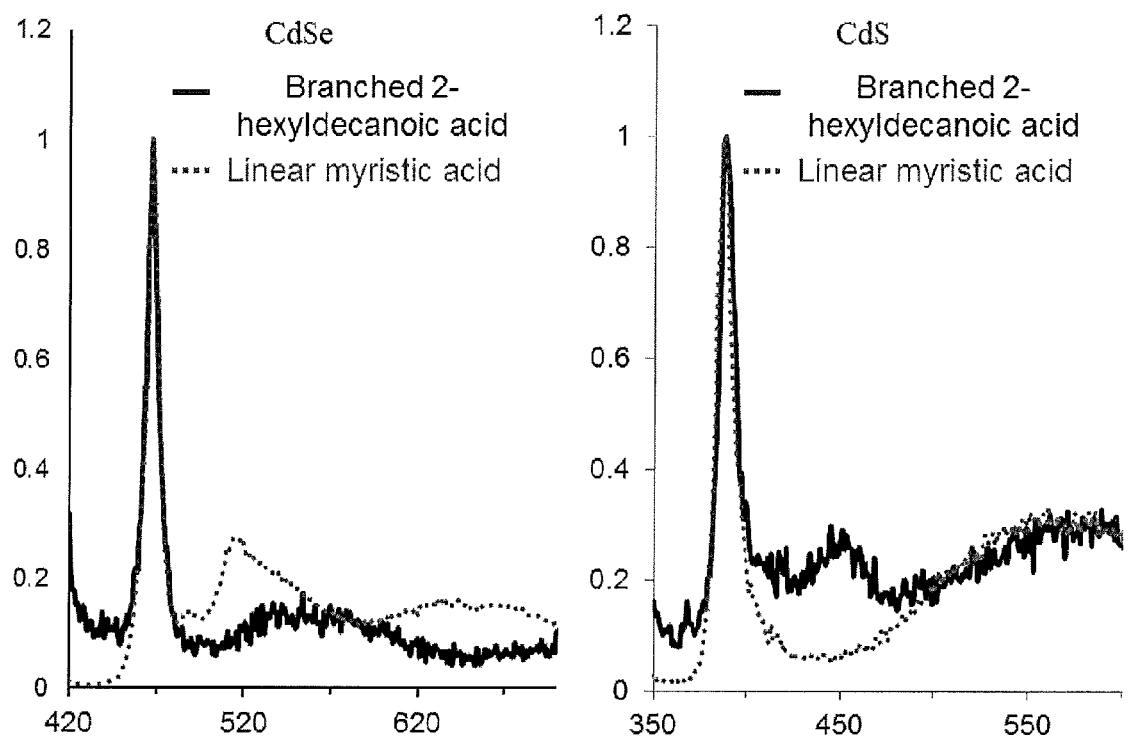
FIG. 1 illustrates the photoluminescent properties of CdSe and CdS colloidal nanocrystals synthesized according to methods described herein with linear myrisitc acid and branched 2-hexyldecanoic acid.

The present invention can be understood more readily by reference to the following detailed description, examples and drawings and their previous and following descriptions. Elements, apparatus and methods of the present invention, however, are not limited to the specific embodiments presented in the detailed description, examples and drawings. It should be recognized that these embodiments are merely illustrative of the principles of the present invention. Numerous modifications and adaptations will be readily apparent to those of skill in the art without departing from the spirit and scope of the invention.

I. Colloidal Semiconductor Nanocrystals

In one aspect, colloidal semiconductor nanocrystals demonstrating one dimensional quantum confinement are provided herein. In some embodiments, a nanocrystal described herein comprises a semiconductor material MX, wherein M is a group II or a group III element and X is a group V or a group VI element to provide a II/VI compound or a III/V compound, the nanocrystal having lateral dimensions and a vertical dimension having the shortest axis, wherein surfaces of the nanocrystal normal or substantially normal to the axis of the vertical dimension comprise a layer of M ions passivated by counter ion chemical species. In some embodiments, surfaces normal or substantially normal to the axis of the vertical dimension are basal planes of the nanocrystal. In some embodiments, one or more basal surfaces of a nanocrystal described herein are atomically flat or substantially atomically flat.

Moreover, in some embodiments, surfaces of a nanocrystal non-normal to the axis of the vertical dimension comprise M ions passivated by counter ion chemical species in addition to the surfaces normal to the axis of the vertical dimension. In some embodiments, for example, one or more side facets of the nanocrystal are terminated with M ions passivated with counter ion chemical species. In some embodiments, all facets of the nanocrystal are terminated with M ions passivated with counter ion chemical species.

In some embodiments, a II/VI compound of a colloidal nanocrystal described herein is selected from the group consisting of ZnS, ZnSe, ZnTe, CdS, CdSe and CdTe. In some embodiments, a III/V compound is selected from the group consisting of AlN, GaN, InN, GaP, InP, GaAs and InAs.

In some embodiments of nanocrystals described herein where Cd is selected for M, for example, surfaces of the nanocrystals normal or substantially normal to the axis of the vertical dimension comprise a layer of Cd ions passivated by one or more counter ion chemical species. In some embodiments, one or more surfaces non-normal to the axis of the vertical dimension also comprise a layer of Cd ions passivated by counter ion chemical species. Similarly, in some embodiments wherein Ga is selected for M, for example, surfaces of the nanocrystals normal or substantially normal to the axis of the vertical dimension comprises a layer of Ga ions passivated by counter ion chemical species. In some embodiments, one or more surfaces non-normal to the axis of the vertical dimension also comprise a layer of Ga ions passivated by counter ion chemical species.

In some embodiments, counter ion chemical species for passivating M ions on surfaces of a nanocrystal described herein comprise one or more carboxylate ligands. Any suitable carboxylate ligands not inconsistent with the objectives of the present invention can be used as a counter ion chemical species for passivating M ions. In some embodiments, carboxylates comprise one of more species of fatty acid carboxylates. In some embodiments, fatty acid carboxylates have a $C_1$-$C_{28}$ hydrocarbon tail. In some embodiments, fatty acid carboxylates have a $C_4$-$C_{29}$ hydrocarbon tail. In some embodiments, fatty acid carboxylates have a $C_{10}$-$C_{29}$ hydrocarbon tail.

In some embodiments, one or more species of fatty acid carboxylates comprise saturated hydrocarbon tails, unsaturated hydrocarbon tails or mixtures thereof. In some embodiments, fatty acid carboxylates having saturated hydrocarbon tails comprise deprotonated forms of lauric acid, myristic acid, palmitic acid, stearic acid, arachidic acid, behenic acid, lignoceric acid or cerotic acid, melissic acid or mixtures thereof. In some embodiments, fatty acid carboxylates having unsaturated hydrocarbon tails comprise deprotonated forms of myristoleic acid, palmitoleic acid, sapienic acid, oleic acid, linoleic acid, α-linolenic acid, arachidon acid, eicosapentaenoic acid, erucic acid or docosahexaenoic acid or mixtures thereof.

In some embodiments, fatty acid carboxylates have linear hydrocarbon tails, branched hydrocarbon tails or mixtures thereof. FIG. 1 illustrates the photoluminescent properties of CdSe and CdS colloidal nanocrystals synthesized according to methods described herein with linear myristic acid and branched 2-hexyldecanoic acid.

In some embodiments, hydrocarbon tails of passivating fatty acid carboxylates form a close-packed monolayer on surfaces of nanocrystals described herein. In some embodiments, the close packing of the hydrocarbon tails assists in the thermal stability of the nanocrystals and can assist in increasing the temperature limit for synthesis of the colloidal nanocrystals as set forth herein.

Figure 2:
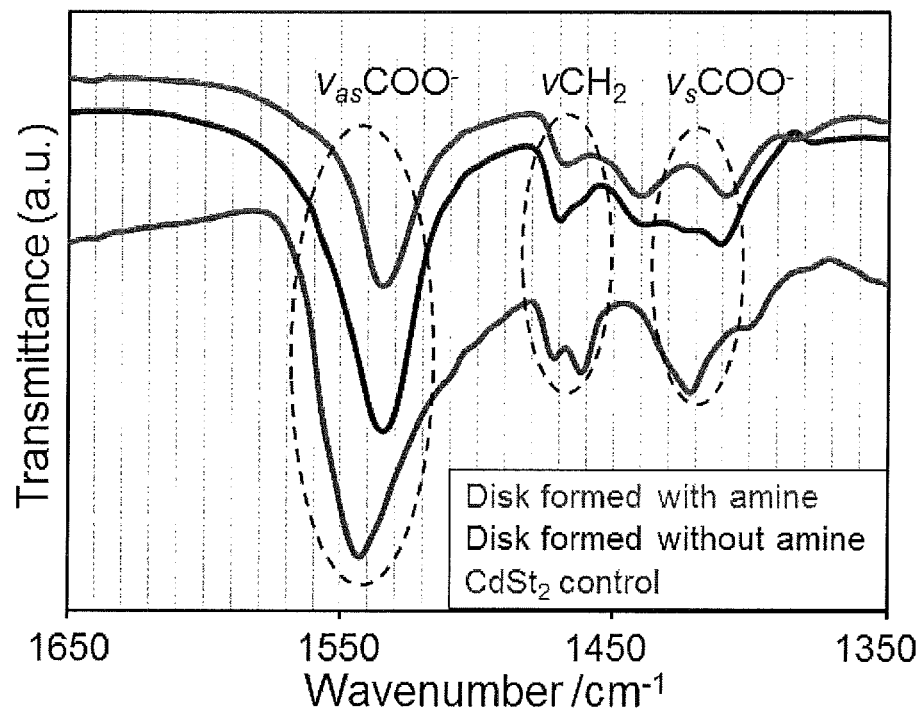
FIG. 2 is an FT-IR spectrum of purified colloidal CdSe nanocrystals according to one embodiment described herein.

In some embodiments, ionic and/or electrostatic interactions between carboxylate groups of the passivating ligands and the M ions display bridging arrangements wherein the carboxylate functionality is shared between adjacent M ions. FIG. 2 is an FT-IR spectrum of purified colloidal CdSe nanocrystals according to one embodiment of described herein. The peak position of the asymmetric vibration and symmetric vibration of the carboxylate group indicates the bonding between the carboxylate group and the surface Cd ions was bridging in nature.

In some embodiments, counter ion chemical species for passivating M ions on surfaces of a nanocrystal described herein comprise fatty acid phosphonates, such as alkyl or alkene phosphonates. In some embodiments, fatty acid phosphonates have a $C_1$-$C_{20}$ hydrocarbon tail. In some embodiments, fatty acid phosphonates have a $C_6$-$C_{18}$ hydrocarbon tail. Additionally, in some embodiments, hydrocarbon tails of phosphonates are linear or branched. In some embodiments, fatty acid phosphonates comprise deprotonated forms of n-decylphosphonic acid, n-dodecylphosphonic acid, n-hexadecylphosphonic acid, n-hexylphosphonic acid, n-octadecylphosphonic acid, n-octylphosphonic acid, n-tetradecylphosphonic acid.

In some embodiments, counter ion chemical species for passivating M ions on surfaces of a nanocrystal described herein comprise fatty acid sulfonates, such as alkyl or alkene sulfonates. In some embodiments, fatty acid sulfonates have a $C_1$-$C_{20}$ hydrocarbon tail. In some embodiments, fatty acid sulfonates have a $C_6$-$C_{18}$ hydrocarbon tail.

In some embodiments, nanocrystals described herein are single crystalline. In some embodiments, nanocrystals described herein have a cubic crystalline structure, including simple cubic, body centered cubic and/or face centered cubic structures. In some embodiments, nanocrystals described herein comprise a zinc blende structure. In some embodiments, for example, CdSe and CdS colloidal nanocrystals having properties described herein display a zinc blend crystalline structure. Alternatively, in some embodiments, nanocrystals described herein have a hexagonal crystalline structure, such as a wurzite structure.

Moreover, in some embodiments, surfaces normal to the axis of the vertical dimension and comprising M ions are basal planes of the nanocrystal. In some embodiments, the axis of the vertical dimension of a nanocrystal is the <001> crystallographic direction. In some embodiments, the axis of the vertical dimension of a nanocrystal is the <111> crystallographic direction. In some embodiments, the axis of the vertical dimension of a nanocrystal is the <100> crystallographic direction.

Nanocrystals described herein, in some embodiments, demonstrate a dilation of the crystal lattice as determined from x-ray diffraction data (XRD) data. In some embodiments, nanocrystals having a structure described herein display a lattice dilation of at least 0.5% as measured by one or more XRD reflections of the lattice. In some embodiments, the nanocrystals display a lattice dilation of at least 1% or at least 2% as measured by one or more XRD reflections. The nanocrystals, in some embodiments, display a lattice dilation of at least 3% or at least 3.5% as measured by one or more XRD reflections. In some embodiments, the nanocrystals demonstrate a lattice dilation ranging from about 0.5% to about 4% or from about 1% to about 3%. Moreover, in some embodiments, lattice dilation of nanocrystals described herein is inversely proportional to the number of monolayers of the semiconductor material in the vertical dimension. Table I summarizes lattice dilation values determined from various XRD reflections of CdS nanocrystals according to embodiments described herein.

As provided in Table I and elsewhere herein, the vertical dimension of the colloidal nanocrystals, in some embodiments, comprises a non-integer number of monolayers of the semiconductor material MX. In some embodiments, for example, the vertical dimension of a colloidal semiconductor nanocrystal comprises half a monolayer more than an integer number. The vertical dimension of a colloidal semiconductor nanocrystal comprises 3.5, 4.5, 5.5, 6.5, 7.5 or 8.5 monolayers of the semiconductor material MX.

In some embodiments, a nanocrystal described herein has lateral dimensions ranging from about 15 nm to about 150 nm. In some embodiments, a nanocrystal described herein has lateral dimensions ranging from about 20 nm to about 125 nm or from about 25 nm to about 100 nm. In some embodiments, a nanocrystal described herein has lateral dimensions ranging from about 30 nm to about 90 or from about 35 to 80 nm.

Moreover, in some embodiments, a nanocrystal described herein has a vertical dimension of up to about 5 nm. In some embodiments, a nanocrystal described herein has a vertical dimension ranging from about 1 nm to about 4 nm or from about 1 nm to about 3 nm.

Figure 3:
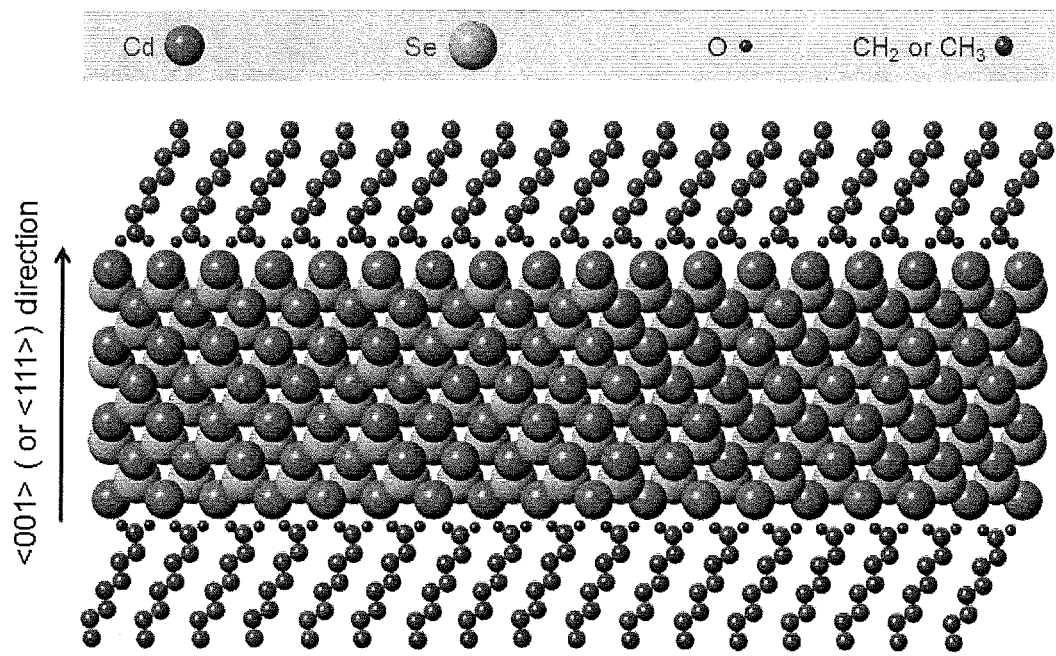
FIG. 3 is a schematic illustration of a colloidal CdSe nanocrystal according to one embodiment described herein.

FIG. 3 is a schematic illustration of a colloidal CdSe nanocrystal according to one embodiment described herein. As illustrated in FIG. 3, the basal plane surfaces of the CdSe nanocrystal are terminated in Cd ions. The Cd ions are passivated by fatty acid carboxylates.

Nanocrystals described herein, in some embodiments, demonstrate photoluminescence. In some embodiments, nanocrystals described herein photoluminesce in one or more regions of the electromagnetic spectrum including the visible region, infrared region and/or ultraviolet region. In some embodiments, photoluminescence from the nanocrystals results from the one-dimensional confinement of excitons.

In some embodiments, nanocrystals described herein demonstrate a photoluminescence emission line having a full width at half maximum (FWHM) of less than about 10 nm. In some embodiments, nanocrystals described herein demonstrate a photoluminescence emission line having a FWHM of less than about 9 nm. In some embodiments, nanocrystals described herein demonstrate a photoluminescence emission line having a FWHM of less than about 8 nm. In some embodiment, the photoluminescence line shape is Lorentzian. In some embodiments, the photoluminescent line shape is Gaussian.

Figure 4:
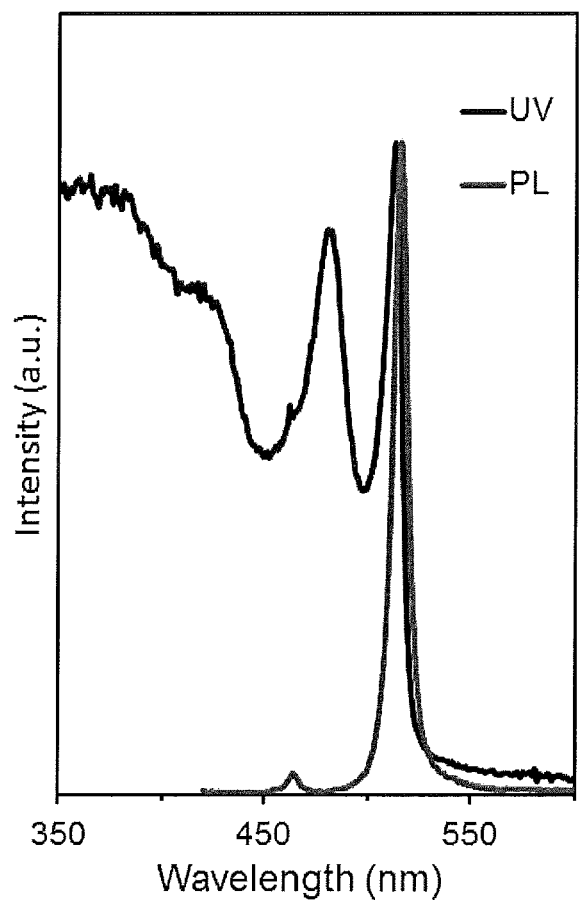
FIG. 4 illustrates absorption/emission profiles of colloidal CdSe nanocrystals having a structure according to one embodiment described herein.
Figure 5:
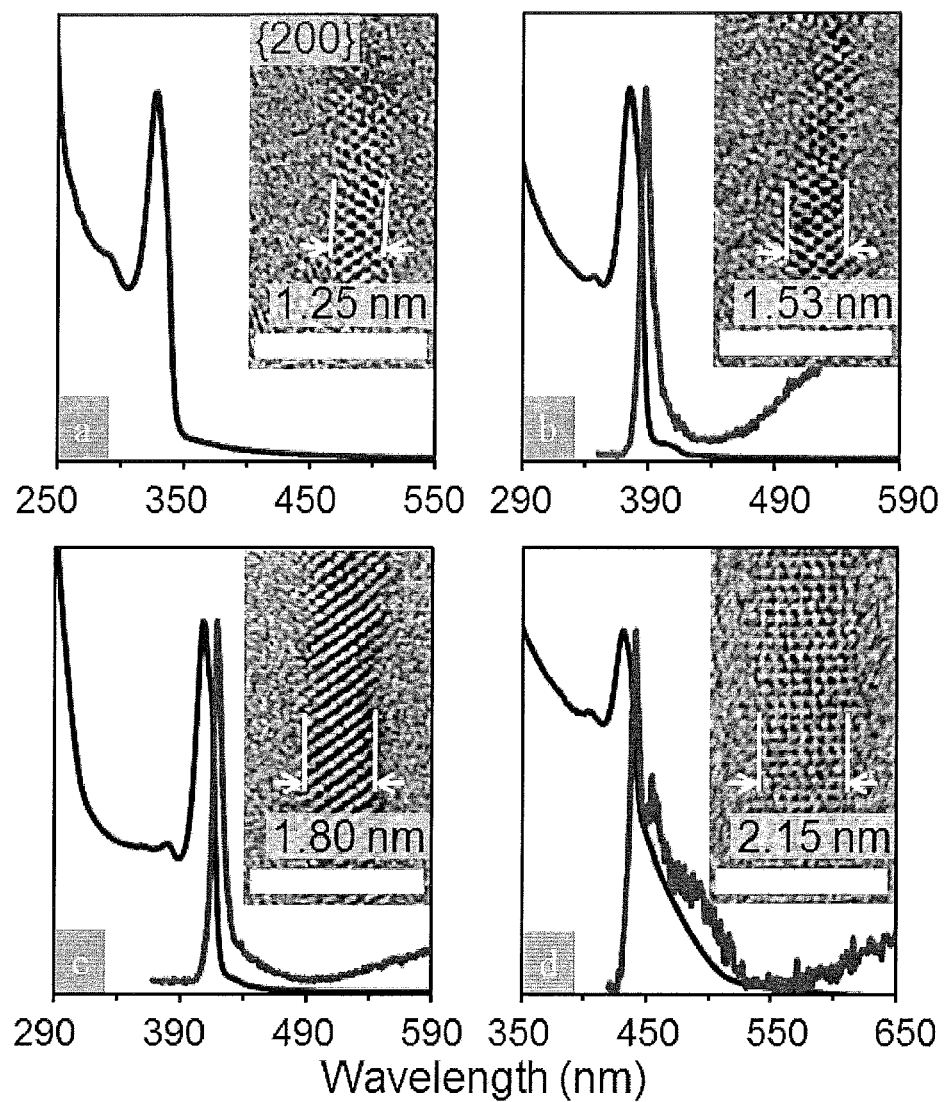
FIG. 5 illustrates absorption/emission profiles and high resolution TEM (HRTEM) images of CdS nanocrystals having structures according to some embodiments described herein.

Additionally, in some embodiments, nanocrystals described herein display a photoluminescent Stokes shift less than about 5 meV. In some embodiments, the nanocrystals display a Stokes shift less than about 4 meV or less than about 3 meV. FIG. 4 illustrates absorption/emission profiles of colloidal CdSe nanocrystals having a structure according to one embodiment described herein. FIG. 5 illustrates absorption/emission profiles and high resolution TEM (HRTEM) images of CdS nanocrystals having structures according to some

TABLE I

| | Lattice Dilation | | | | | | | |
|---|---|---|---|---|---|---|---|---|
| Peak | Standard (Å) | 4.5-layer (Å) | Dilation (%) | 5.5-layer (Å) | Dilation (%) | 6.5-layer (Å) | Dilation (%) | 7.5-layer (Å) | Dilation (%) |
| 111 | 3.366 | 3.500 | 3.97 | 3.484 | 3.51 | 3.409 | 1.29 | 3.368 | 0.07 |
| 200 | 2.915 | 2.979 | 2.19 | 2.987 | 2.48 | 2.956 | 1.42 | 2.951 | 1.22 |
| 220* | 2.061 | 2.108 | 2.27 | 2.109 | 2.35 | 2.088 | 1.32 | 2.064 | 0.17 |
| 311 | 1.758 | 1.800 | 2.40 | 1.791 | 1.88 | 1.775 | 0.95 | 1.762 | 0.23 |
| 400 | 1.458 | 1.494 | 2.50 | 1.488 | 2.07 | 1.478 | 1.38 | 1.467 | 0.65 |

*For the (220) peak, the sharp peak position was taken to calculate the corresponding lattice value.

embodiments described herein. The four nanocrystal samples illustrated in FIG. 5 demonstrated structural parameters provided in Table II.

TABLE II

CdS Nanocrystal Properties

| CdS Nanocrystal Sample | Crystalline Structure | CdS Monolayers | Vertical Dimension (Thickness)* |
|---|---|---|---|
| a | Zinc blend | 4.5 | 1.25 nm |
| b | Zinc blend | 5.5 | 1.53 nm |
| c | Zinc blend | 6.5 | 1.80 nm |
| d | Zinc blend | 7.5 | 2.15 nm |

*Determined by HRTEM

In some embodiments, nanocrystals described herein display a photoluminescent quantum yield (PLQY) of greater than 5%. Nanocrystals described herein, in some embodiments, display a PLQY of at least about 10% or at least about 20%. In some embodiments, the nanocrystals display a PLQY of at least about 30% or at least about 40%. In some obtained from a FLS 920 spectrometer. The decay profiles of the CdS nanocrystals and CdS quantum dots were both fitted into double exponential decay with average lifetimes of the CdS nanocrystals having a structure described herein at about 160 ps and the CdS quantum dots at around 22 ns. Control for the lifetime measurements was administered on the streak camera with the same set-up and a 375 nm laser pulse width (FWHM) on the 20 ps scale, excluding the effect of system response and laser width on lifetime measurements for the CdS nanocrystals. Erythrosin B in methanol was used as the standard to test streak camera response, which gave a single-exponential decay with a lifetime of 455 ps. This was within the error range reported value of 470+/−20 ps for erythrosine B. CdS nanocrystals having a structure described herein with their first absorption peaks at 374 nm and 431 nm were also measured using the same set up on the streak camera with corresponding photoluminescent lifetimes of 54 ps and 46 ps respectively. Table III provides a summary of photoluminescent lifetime parameters for CdS nanocrystals described herein in comparison with CdS quantum dots.

TABLE III

Photoluminescent Lifetimes

| UV peak (nm) | Thickness/size (nm) | $A_1$ | $\tau_1$ (ps) | $f_1$ | $A_2$ | $\tau_2$ (ps) | $f_2$ | $\bar{\tau}$ (ps) | QY (%) | $\tau_n$ (ps) | $K_r$ (s$^{-1}$) | $K_{nr}$ (s$^{-1}$) |
|---|---|---|---|---|---|---|---|---|---|---|---|---|
| 405_CdS dots | 3.55 | 786 | 4439 | 0.192 | 566 | 26003 | 0.808 | 21870 | 13.44 | 162712 | 6.15E+06 | 3.96E+07 |
| 374_CdS disks | 1.53 | 68852 | 49 | 0.986 | 126 | 391 | 0.014 | 54 | 0.44 | 12350 | 8.10E+07 | 1.84E+10 |
| 407_CdS disks | 1.80 | 2000 | 47 | 0.616 | 164 | 358 | 0.384 | 167 | 0.59 | 28400 | 3.52E+07 | 5.97E+09 |
| 431_CdS disks | 2.15 | 1844630 | 46 | 0.999 | 291 | 371 | 0.001 | 46 | 0.25 | 18269 | 5.47E+07 | 2.17E+10 |
| 513_CdSe disks | 1.82 | 1234 | 143 | 0.216 | 1170 | 547 | 0.784 | 460 | 38.07 | 1208 | 8.28E+08 | 1.35E+09 | embodiments, the nanocrystals have a PLQY ranging from about 5% to about 50% or from about 10% to about 40%

In some embodiments, nanocrystals described herein have a photoluminescent lifetime less than 1 nanosecond (ns). Nanocrystals described herein, in some embodiments, have a photoluminescent lifetime less than 500 picoseconds (ps) or less than 200 ps. In some embodiments, the nanocrystals have a photoluminescent lifetime ranging from about 10 ps to about 500 ps. In some embodiments, the nanocrystals have a photoluminescent lifetime ranging from about 200 ps to about 300 ps or from about 100 ps to about 200 ps. In some embodiments, the nanocrystals have a photoluminescent lifetime ranging from about 40 ps to about 100 ps.

Figure 6:
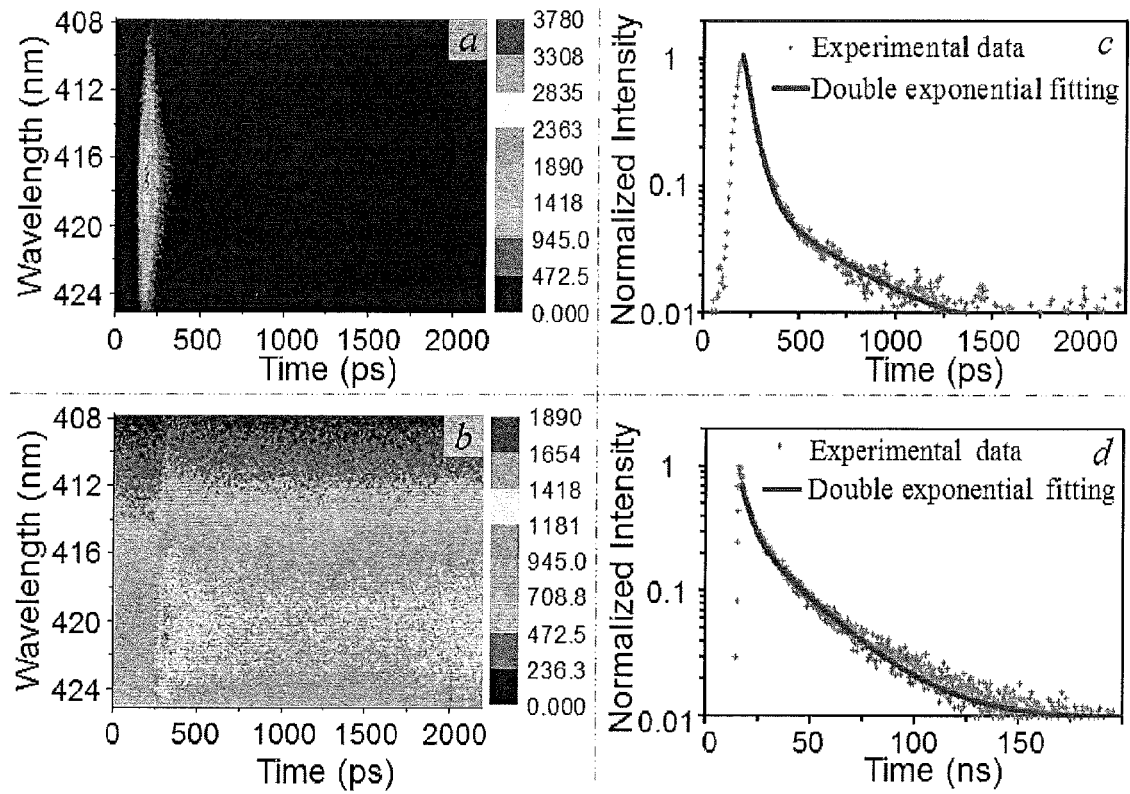
FIG. 6 illustrates streak camera images of fluorescence from CdS nanocrystals according to one embodiment described herein and the associated temporal decay profile in comparison with the same for CdS quantum dots.

FIG. 6 illustrates streak camera images of fluorescence from CdS nanocrystals according to one embodiment described herein and the associated temporal decay profile in comparison with the same for CdS quantum dots. The CdS nanocrystals of FIG. 6 having a structure according to one embodiment described herein displayed photoluminescent peak position about 418 nm. As illustrated in FIG. 6(a), the CdS nanocrystals having a structure described herein demonstrated sharp photoluminescent emission, which decayed to the background level completely in several hundred picoseconds. This is in contrast to the CdS quantum dots of FIG. 6(b), which showed continuous emission up to the scan time limit of the streak camera. FIG. 6(c) shows the photoluminescent decay profile of the CdS nanocrystals of FIG. 6(a), and FIG. 6(d) displays the photoluminescent decay profile of the CdS quantum dots of FIG. 6(b). The decay profiles were In another aspect, compositions comprising colloidal nanocrystals are provided herein. In some embodiments, a composition comprises colloidal nanocrystals comprising a semiconductor material MX, wherein M is a group II element or a group III element and X is a group V or a group VI element to provide a II/VI compound or a III/V compound, the nanocrystals having lateral dimensions and a vertical dimension having the shortest axis, wherein surfaces of the nanocrystals normal or substantially normal to the axis of the vertical dimension comprise a layer of M ions passivated by a counter ion chemical species. In some embodiments, surfaces normal or substantially normal to the axis of the vertical dimension are basal planes of the nanocrystals.

Colloidal semiconductor nanocrystals of a composition, in some embodiments, can have properties, constructions and/or structures consistent with any nanocrystal described herein, including properties, constructions and/or structures recited in this Section I. In some embodiments, for example, the vertical dimension of the colloidal nanocrystals comprises a non-integer number of monolayers of the semiconductor material MX as described herein. Moreover, in some embodiments, colloidal semiconductor nanocrystals of a composition have dimensions, shape, photoluminescent properties, compositional properties and/or lattice dilation properties consistent with any nanocrystal described herein.

The colloidal semiconductor nanocrystals, in some embodiments, are monodisperse or substantially monodisperse in the vertical dimension. In some embodiments, the colloidal semiconductor nanocrystals are monodisperse or substantially monodisperse in at least one lateral dimension. In some embodiments, the colloidal semiconductor nanocrystals are monodisperse or substantially monodisperse in the vertical dimension and in one or more lateral dimensions. Additionally, in some embodiments, the colloidal semiconductor nanocrystals demonstrate any of the foregoing monodispersities without being subjected to size sorting procedure(s).

In comprising lateral dimensions and a vertical dimension having the shortest axis, colloidal nanocrystals described herein, in some embodiments, have a disc shape. In some embodiments, for example, colloidal nanocrystals described herein have a square or rectangular disc shape. In some embodiments, colloidal nanocrystals of a composition demonstrate the same or substantially the shape disc shape. The colloidal semiconductor nanocrystals of a composition, in some embodiments, can demonstrate the same or substantially shape without being subjected to shape sorting procedure(s).

Figure 7:
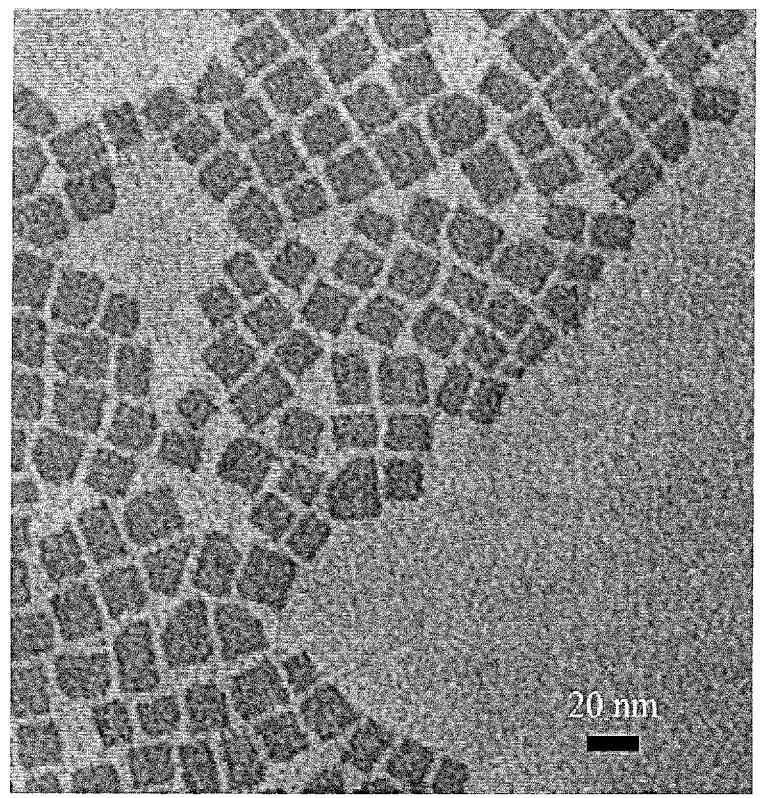
FIG. 7 illustrates colloidal nanocrystals of a composition according to one embodiment described herein.

FIG. 7 illustrates colloidal nanocrystals of a composition according to one embodiment described herein. As illustrated in FIG. 7, the colloidal nanocrystals are substantially monodisperse in at least one lateral dimension and display the same or substantially the same square disc shape without being subjected to size sorting procedures to remove other nanocrystal discs.

Semiconductor nanocrystals described herein can find application in a variety of fields. In some embodiments, lighting compositions comprise nanocrystals described herein. In some embodiments, for example, a lighting composition comprises one or more light emitting diodes or lasers including nanocrystals described in this Section I. In some embodiments, photovoltaic apparatus comprise nanocrystals described herein. Moreover, in some embodiments, nanocrystals described herein, including nanocrystals described in this Section I, are used as biological labeling agents and/or sensors. In some embodiments, for example, a biological composition comprises nanocrystals described herein as labeling agents or markers for one or more targets of interest.

II. Methods of Synthesizing Colloidal Semiconductor Nanocrystals

Figure 8:
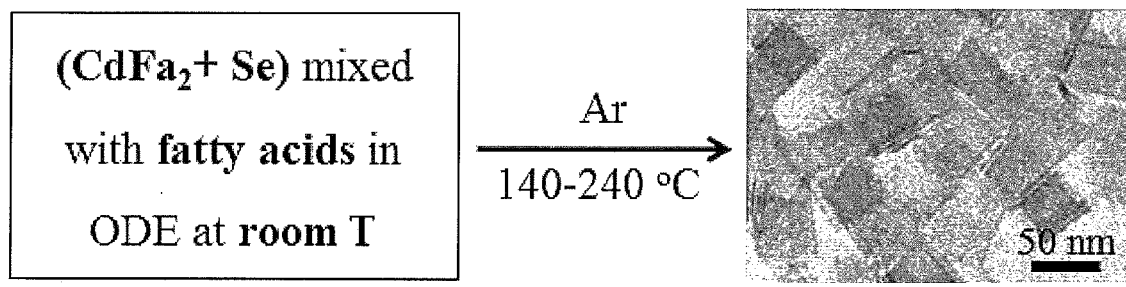
FIG. 8 illustrates a general reaction scheme for synthesizing colloidal CdSe nanocrystals according to one embodiment described herein.

In another aspect, methods of synthesizing colloidal semiconductor nanocrystals are provided. In some embodiments, a method of synthesizing colloidal semiconductor nanocrystals of the formula MX comprises adding to a reaction vessel a cation precursor (M) comprising a metal salt, adding to the reaction vessel one or more fatty acid species to provide a mixture comprising the cation precursor and the one or more fatty acid species, adding an anion precursor (X) to the reaction vessel and heating the mixture to a reaction temperature sufficient to form the colloidal semiconductor nanocrystals having lateral dimensions and a vertical dimension having the shortest axis, wherein surfaces of the nanocrystal normal or substantially normal to the axis of the vertical dimension comprise a layer of M ions passivated by counter ion chemical species. In some embodiments, surfaces normal or substantially normal to the axis of the vertical dimension are basal planes of the nanocrystals. In some embodiments, the vertical dimension of the colloidal nanocrystals comprises a non-integer number of monolayers of the semiconductor material MX. In some embodiments, MX comprises a II/VI compound or a III/V compound. FIG. 8 illustrates a general reaction scheme for synthesizing colloidal semiconductor nanocrystals according to one embodiment described herein, including carboxylates, phosphonates or sulfonates or mixtures thereof.

The anion precursor (X), in some embodiments, is added to the reaction vessel prior to the mixture reaching the reaction temperature. In some embodiments, for example, the anion precursor (X) is added to the reaction vessel at room temperature. In some embodiments, the anion precursor is added to the reaction vessel once the mixture has reached or passed the reaction temperature.

In some embodiments of methods described herein, the cation precursor (M) comprises a metal fatty acid salt. In some embodiments, a metal fatty acid salt is a fatty acid salt of a group II metal. In some embodiments, a metal fatty acid salt is a fatty acid salt of a group III metal. In some embodiments, for example, a cation precursor comprises a zinc fatty acid salt or a cadmium fatty acid salt. Fatty acids suitable for forming a metal fatty acid salt, in some embodiments, can comprise any of the fatty acids described herein.

Moreover, in some embodiments, the anion precursor comprises elemental powder of a group V element or a group VI element. In some embodiments, for example, an anion precursor comprises sulfur or selenium powder. In some embodiments wherein elemental compositions are used for the anion precursor, an activation agent, such as olelyamine, may be added to the mixture when lower reaction temperatures are contemplated.

In some embodiments, the one or more fatty acid species added to the reaction vessel to form a reaction mixture with the cation precursor (M) can comprise any of the fatty acid species described herein, including fatty acid carboxylates, phosphonates and/or sulfonates. Additionally, in some embodiments, the one or more fatty acid species is not associated with a metal prior to addition to the reaction vessel.

In some embodiments, the mixture of a method described herein further comprises an organic solvent. In some embodiments, the organic solvent is a non-coordinating organic solvent. Useful non-coordinating solvents for preparing high quality semiconductor nanocrystals are generally selected using the following guidelines. First, the solvent should possess a relatively high boiling point (around 300° C. or higher) for growing highly crystalline nanocrystals and a relatively low melting point (approximately 20° C. or lower) for a convenient, room temperature workup after synthesis. Typically, useful non-coordinating solvents will have a melting point less than about 25° C. and a boiling point greater than about 250° C. Second, reactants and products alike should be soluble and stable in the selected solvent. Third, the solvent should be as universal as possible for its ability to dissolve common starting materials and therefore for synthesizing high quality inorganic nanocrystals. Finally, the solvent should be safe, relatively inexpensive, and easy to dispose of or recycle. Using the four standards set forth above, it was determined that octadecene (ODE) (Aldrich Chemical Company, Milwaukee, Wis.) is a suitable solvent choice.

In some embodiments of methods described herein, the mixture is heated to a temperature ranging from about 120° C. to about 260° C. In some embodiments, the mixture is heated to a temperature ranging from about 140° C. to about 250° C.

Figure 9:
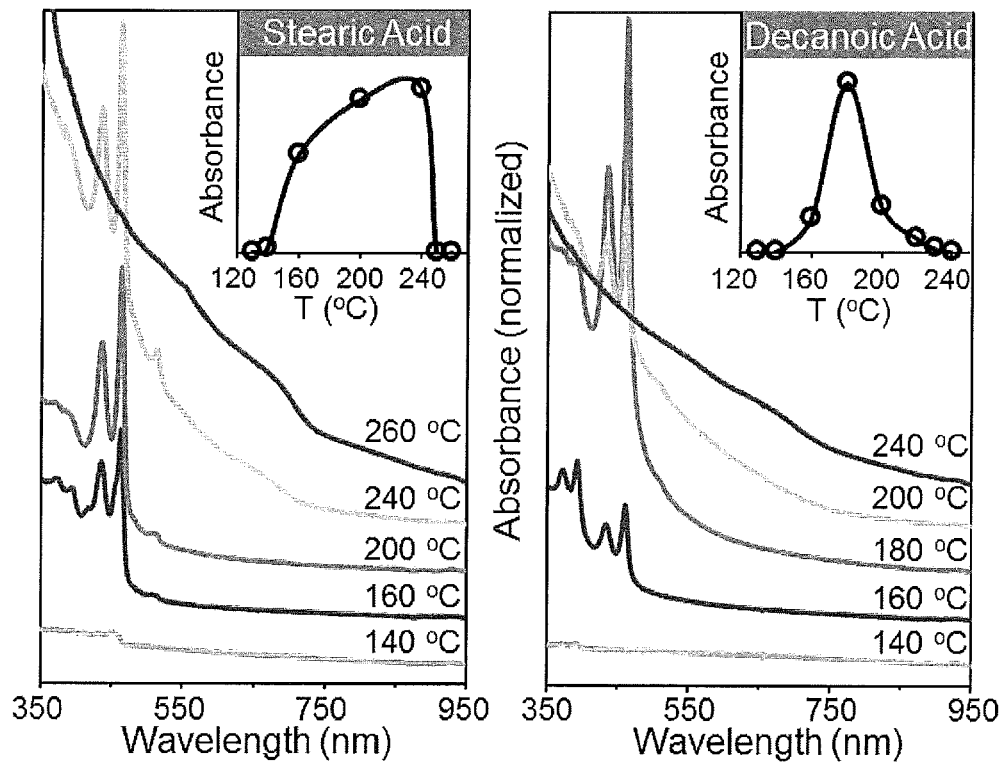
FIG. 9 illustrates temperature dependent UV-Visible spectra of colloidal nanocrystals synthesized according to some embodiments of methods described herein.
Figure 10:
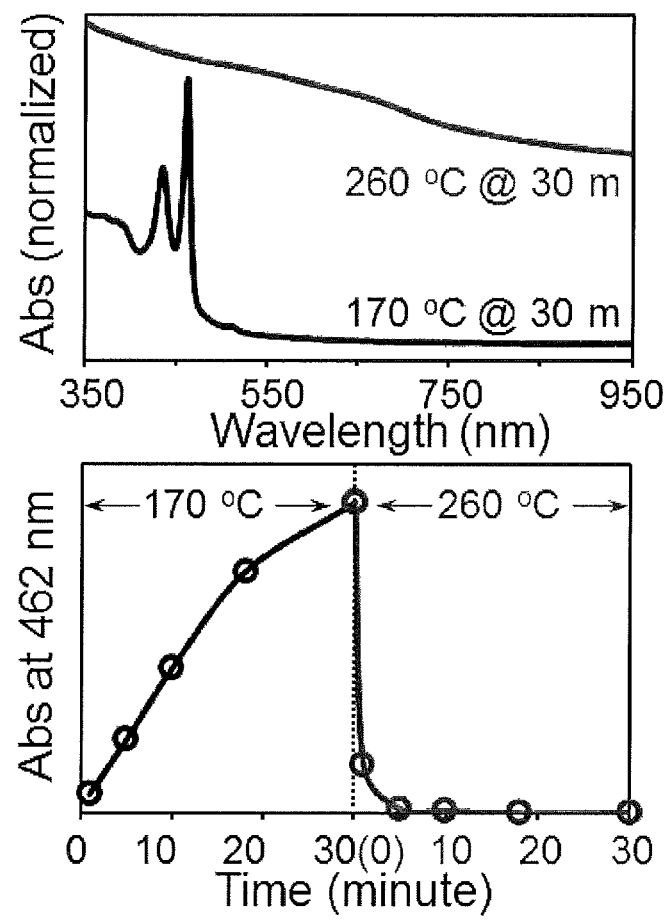
FIG. 10 illustrates the thermal stability of CdSe nanocrystals synthesized according to one embodiment of a method described herein.

FIG. 9 illustrates temperature dependent UV-Visible spectra of colloidal nanocrystals synthesized according a method described herein using stearic acid and decanoic acid as the fatty acid species. As illustrated in FIG. 9, the longer hydrocarbon tail of stearic acid permitted a higher nanocrystal synthesis temperature. Moreover, FIG. 10 illustrates the thermal stability of CdSe nanocrystals synthesized according to one embodiment described herein. As illustrated in FIG. 10, the colloidal CdSe nanocrystals became unstable and degraded at temperatures exceeding 260° C.

In another aspect, a method of synthesizing colloidal semiconductor nanocrystals of the formula MX having a vertical dimension (z) in a first predetermined size range, a first lateral dimension (x) in a second predetermined size range and a second lateral dimension (y) in a third predetermined size range comprises adding to a reaction vessel a cation precursor (M) comprising a metal salt, adding to the reaction vessel one or more fatty acid species to provide a mixture comprising the cation precursor and the one or more fatty acid species, adding an anion precursor (X) to the reaction vessel and heating the mixture to a reaction temperature sufficient to provide the semiconductor nanocrystals (MX) the vertical dimension (z) in the first predetermined size range. The one or more fatty acid species stabilize the semiconductor nanocrystals at the reaction temperature, and the semiconductor nanocrystals are maintained at the reaction temperature for a time period sufficient to provide the semiconductor nanocrystals the first lateral dimension (x) in the second predetermined size range and the second lateral dimension (y) in the third predetermined size range, wherein the vertical dimension is the shortest dimension of the colloidal nanocrystals. In some embodiments, the anion precursor (X) added to the reaction vessel prior to the mixture reaching the reaction temperature. Alternatively, in some embodiments, the anion precursor (X) is added to the reaction vessel once the mixture has reached or passed the reaction temperature.

In some embodiments, the first predetermined size range of the vertical dimension can be any of the size ranges provided in Table IV:

TABLE IV

| First Predetermined Size Range (nm) for the Vertical Dimension (z) |
|---|
| z |
| 1-2 |
| 2-3 |
| 1-1.5 |
| 1.5-2 |
| 2-2.5 |
| 2.5-3 |
| 1-1.3 |
| 1.3-1.6 |
| 1.6-1.9 |
| 2-2.3 |
| 2.3-2.6 |
| 2.6-2.9 |

In some embodiments, the second predetermined size range of the first lateral dimension (x) can be any of the size ranges provided in Table V.

TABLE V

| Second Predetermined Size Range (nm) for the First Lateral Dimensions (x) |
|---|
| x |
| 10-30 |
| 30-50 |
| 50-70 |
| 70-90 |
| 90-110 |
| 110-130 |
| 130-150 |
| 10-20 |
| 20-30 |
| 30-40 |
| 40-50 |
| 50-60 |
| 60-70 |
| 70-80 |
| 80-90 |
| 90-100 |
| 100-110 |
| 110-120 |

TABLE V-continued

| Second Predetermined Size Range (nm) for the First Lateral Dimensions (x) |
|---|
| x |
| 120-130 |
| 130-140 |
| 140-150 |

In some embodiments, the third predetermined size range of the second lateral dimension (x) can be any of the size ranges provided in Table VI:

TABLE VI

| Second Predetermined Size Range (nm) for the Second Lateral Dimension (y) |
|---|
| y |
| 10-30 |
| 30-50 |
| 50-70 |
| 70-90 |
| 90-110 |
| 110-130 |
| 130-150 |
| 10-20 |
| 20-30 |
| 30-40 |
| 40-50 |
| 50-60 |
| 60-70 |
| 70-80 |
| 80-90 |
| 90-100 |
| 100-110 |
| 110-120 |
| 120-130 |
| 130-140 |
| 140-150 |

Embodiments of the present method contemplate any and all combinations of first predetermined size range, second predetermined size range and third predetermined size range selected from Tables IV-VI to provide colloidal nanocrystals with dimensions (x,y,z). In some embodiments, the colloidal nanocrystals are monodisperse or substantially monodisperse in at least one dimension x, y or z. In some embodiments, the colloidal nanocrystals are monodisperse or substantially monodisperse or substantially monodisperse in the lateral dimensions (x,y).

In some embodiments, the mixture is heated to a reaction temperature ranging from about 120° C. to about 260° C. to provide the colloidal nanocrystals a vertical dimension in the first predetermined size range. Additionally, in some embodiments, the colloidal nanocrystals are maintained at the reaction temperature for a time period ranging from about 1 minute to about 1 hour to provide lateral dimensions in the second and third predetermined size ranges.

In another aspect, methods of controlling one or more lateral dimensions of a colloidal semiconductor nanocrystal are provided. In some embodiments, a method of controlling one or more lateral dimensions of a colloidal semiconductor nanocrystal of the formula MX comprises adding to a reaction vessel a cation precursor (M) comprising a metal salt, varying the amount of one or more fatty acid species added to the reaction vessel to provide a mixture comprising the cation precursor and the one or more fatty acid species, adding an anion precursor (X) to the reaction vessel and heating the mixture to a reaction temperature sufficient to form the colloidal semiconductor nanocrystals. In some embodiments, the mixture is heated to a temperature ranging from about 120° C. to about 260° C. or from about 140° C. to about 250° C.

The anion precursor (X), in some embodiments, is added to the reaction vessel prior to the mixture reaching the reaction temperature. In some embodiments, the anion precursor (X) added to the reaction vessel once the mixture has reached or passed the reaction temperature. Additionally, varying the amount of one or more fatty acid species, in some embodiments, comprises increasing the amount of the one or more fatty acid species to decrease one or more lateral dimensions of the colloidal semiconductor nanocrystal.

In some embodiments, a method of controlling one or more lateral dimensions of a colloidal semiconductor nanocrystal of the formula MX comprises adding to a reaction vessel a cation precursor (M) comprising a metal salt, varying the hydrocarbon chain length of one or more fatty acid species added to the reaction vessel with the cation precursor to provide a mixture comprising the cation precursor and the one or more fatty acid species, adding an anion precursor (X) to the reaction vessel and heating the mixture to a reaction temperature sufficient to form the colloidal semiconductor nanocrystals. In some embodiments, the mixture is heated to a temperature ranging from about 120° C. to about 260° C. or from about 140° C. to about 250° C. Varying the hydrocarbon chain length of one or more fatty acid species, in some embodiments, comprises increasing the hydrocarbon chain length of the one or more fatty acid species to decrease one or more lateral dimensions of the colloidal semiconductor nanocrystal.

Colloidal semiconductor nanocrystals produced and/or controlled according to methods described herein, in some embodiments, are monodisperse or substantially monodisperse in the vertical dimension. In some embodiments, the colloidal semiconductor nanocrystals are monodisperse or substantially monodisperse in at least one lateral dimension. In some embodiments, the colloidal semiconductor nanocrystals are monodisperse or substantially monodisperse in the vertical dimension and in one or more lateral dimensions. Additionally, in some embodiments, colloidal semiconductor nanocrystals produced according to methods described herein demonstrate any of the foregoing monodispersities without being subjected to size sorting procedure(s).

Colloidal semiconductor produced and/or controlled according to methods described herein, in some embodiments, have a disc shape. In some embodiments, for example, colloidal nanocrystals have a square or rectangular disc shape. In some embodiments, colloidal nanocrystals produced and/or controlled according to methods described herein demonstrate the same or substantially the same disc shape. The colloidal semiconductor nanocrystals, in some embodiments, can demonstrate the same or substantially the same shape without being subjected to shape sorting procedure(s).

In some embodiments of methods described herein, the ratio of cation precursor (M) to anion precursor (X) in the mixture is greater than 2. In some embodiments, the ratio of cation precursor (M) to anion precursor (X) in the mixture is at least 2.5 or at least 3. In some embodiments, the ratio of cation precursor (M) to anion precursor (X) in the mixture is at least 4 or greater than 4. In some embodiment the ratio of cation precursor (M) to anion precursor (X) is at least 5 or at least 6. In some embodiments, the ratio of cation precursor (M) to anion precursor (X) in the mixture is at least 10 or at least 20.

In some embodiments, methods described herein further comprise purifying the colloidal semiconductor nanocrystals.

In some embodiments, purifying comprises combining the colloidal semiconductor nanocrystals with a mixture comprising one or more organophosphines and one or more alcohols to provide a purification mixture. In some embodiments, organophosphines suitable for use in colloidal nanocrystal purification comprise alkyl phosphines, alkenyl phosphines or aryl phosphines or mixtures thereof. In some embodiments, for example, an organophosphine comprises tributylphosphine. Moreover, in some embodiments, alcohols suitable for use in colloidal nanocrystal purification comprise methanol, ethanol or propyl alcohol or mixtures thereof. In some embodiments, the purification mixture is sonicated followed by centrifuging.

Embodiments of compositions and methods described herein are further illustrated by the following non-limiting examples.

EXAMPLE 1

Synthesis and Characterization of CdSe Nanocrystals having 1-Dimensional Quantum Confinement Materials:

Cadmium acetate dihydrate (Alfa), stearic acid (Alfa), decanoic acid (Avocado), oleic acid (Aldrich), octanoic acid (Alfa), oleylamine (Aldrich), myristic acid (Alfa), selenium (Alfa), 1-octadecene (ODE, Alfa), tributylphosphine (TBP, Alfa), CdSe Microanalysis Compound Standards (EMS), ethanol (Pharmco), methanol (EM Science), hexanes (EM Science), chloroform (EM Science), acetone (EM Science), toluene (Mallinchrodt) were used without further purification.

Synthesis of CdSe Nanocrystal Discs:

Synthesis was carried out as following. For a typical reaction, 0.0533 g cadmium acetate dihydrate (0.20 mmol), 0.0040 g selenium (0.05 mmol), 0.0142 g stearic acid (0.05 mmol) and 4.0 g ODE was heated to designated temperature under Ar flow, small aliquots were taken out at different time intervals, diluted in toluene and measured by UV-Vis to monitor the reaction. The total amount of quantum nanocrystals from one synthesis reaction was on the milligram scale.

Figure 11:
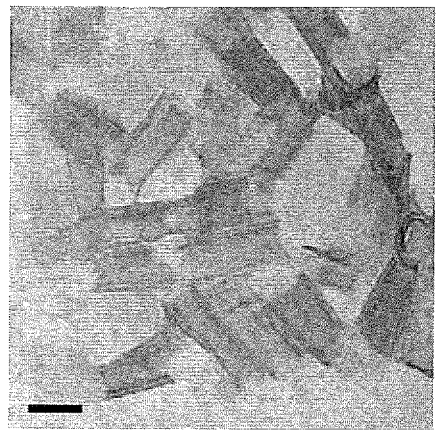
FIG. 11 illustrates colloidal CdSe nanocrystals having structures according to one embodiment described herein.
Figure 11:
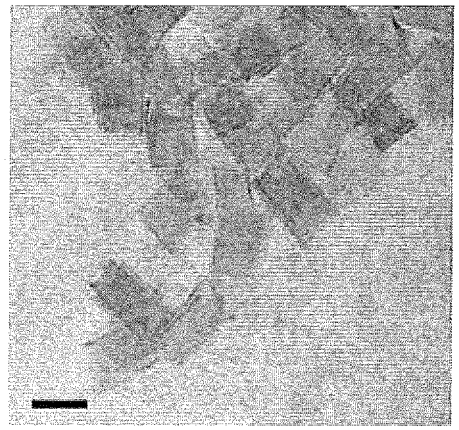
Figure 11:
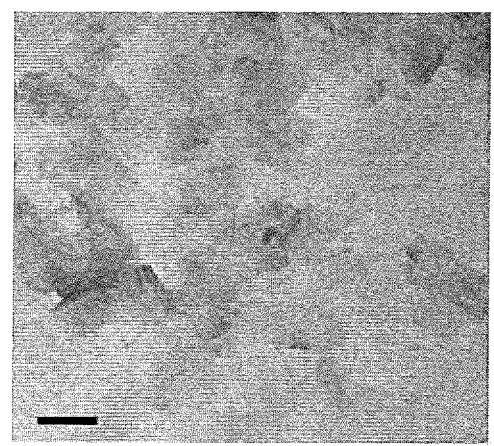

Examples of CdSe nanocrystals with different lateral dimensions were synthesized with different chain length/concentration of fatty acid and reaction temperature. For instance, 0.0533 g cadmium acetate dihydrate (0.20 mmol), 0.0040 g selenium (0.05 mmol), 0.0057 g myristic acid (0.025 mmol) and 4.0 g ODE was heated up to 170° C. and reacted for 30 minutes, corresponding to FIG. 11(A); 0.0533 g cadmium acetate dihydrate (0.20 mmol), 0.0040 g selenium (0.05 mmol), 0.0114 g myristic acid (0.05 mmol) and 4.0 g ODE was heated up to 170° C. and reacted for 30 minutes, corresponding to FIG. 11(B); 0.0533 g cadmium acetate dihydrate (0.20 mmol), 0.0040 g selenium (0.05 mmol), 0.0142 g stearic acid (0.05 mmol) and 4.0 g ODE was heated up to 170° C. and reacted for 15 minutes, corresponding to FIG. 11(C).

Synthesis of CdSe nanocrystals with the addition of oleylamine under low temperatures was carried out in the following way. Cadmium acetate dihydrate (0.0533 g, 0.20 mmol), 0.0040 g selenium (0.05 mmol), 0.0142 g stearic acid (0.05 mmol), 0.05 g oleylamine (0.19 mmol) and 3.95 g ODE was mixed together and then heated to 120° C. under Ar protection. Small aliquots were taken out at different time intervals, and diluted in toluene and measured by UV-Vis to monitor the reaction.

The PL QY of CdSe nanocrystals were measured by comparing fluorescence intensity of coumarin 460 in ethanol with CdSe nanocrystals in toluene, with the same absorbance value at excitation wavelength (333 nm) and similar fluorescence wavelength.

Figure 12:
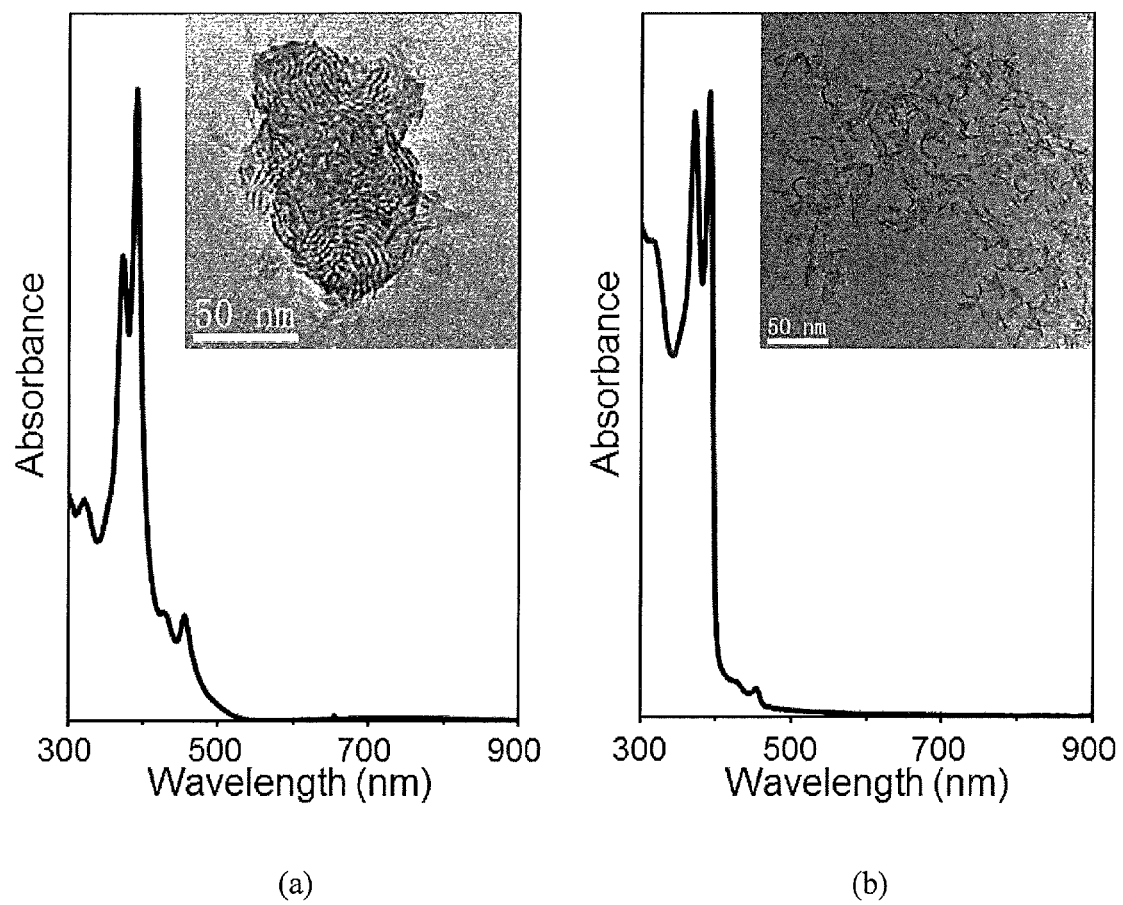
FIG. 12 illustrates colloidal CdSe nanocrystals having structures according to one embodiment described herein.

Synthesis of CdSe nanocrystal discs without cadmium acetate—0.20 mmol cadmium octanoate, 0.05 mmol Se, 0.10 mmol stearic acid and 4 g of ODE was mixed together at and heated to 150° C. and reacted for 30 minutes. UV-Vis absorption spectrum of the CdSe nanocrystals after purification and background subtraction and the corresponding TEM image (insert) are provided in FIG. 12(a).

Synthesis of CdSe nanocrystal discs without cadmium acetate—0.20 mmol cadmium butanoate, 0.05 mmol Se, 0.10 mmol stearic acid and 4 g of ODE was mixed together at and heated to 150° C. and reacted for 30 minutes. UV-Vis absorption spectrum of the CdSe nanocrystals after purification and background subtraction and the corresponding TEM image (insert) are provided in FIG. 12(b).

Purification of CdSe Nanocrystal Discs for Different Measurements:

Purification of CdSe nanocrystals having 1-dimensional quantum confinement was generally carried out by following procedure: TBP and EtOH mixture (10% volume ratio of TBP) was added into the final products, sonicated, then centrifuged at 14,000 RPM for 15 minutes, precipitate was preserved, and repeated for another 2 times. The purified samples were dissolved into toluene or hexanes forming clear solution.

Purification of the CdSe nanocrystals for XRD characterization was the same as the aforementioned procedure except that: centrifugation was carried out at 3,000 RPM for 15 minutes, and EtOH was used to wash the precipitate one more time, the final precipitate was preserved and dried in vacuum oven overnight before grinding in mortar for XRD analysis.

Purification of the CdSe nanocrystals for EDX analysis was carried out by the general procedure except following difference: all the centrifugation was carried out at 14,000 RPM for 5 minutes. The samples were first centrifugated to separate nanocrystals from the solvent, supernatant decanted. And EtOH was applied to wash the samples for another three times. Final products were dried in vacuum oven overnight before applied to the conducting tape for EDX analysis.

Purification of CdSe nanocrystals for FT-IR analysis was carried out by following procedure: the samples were centrifugated at 14,000 RPM for 15 minutes to separate nanocrystals from the solvent, supernatant decanted. Precipitate was dissolved into hexanes, methanol was added into the solution, and analog vortex mixer was used to enhance extraction efficiency. The solution was set aside until forming separated layers, hexanes layer was carefully separately from methanol layer, and the hexanes layer was centrifugated at 14,000 RPM for 15 minutes. Then supernatant was decanted and the precipitate was dissolved into hexanes.

Optical Measurements of CdSe Nanocrystal Discs:

UV-Vis spectra were taken on an HP 8453 UV-visible spectrophotometer. Photoluminescence spectra were measured using a Spex Fluorolog-3 fluorometer.

Transmission Electron Microscopy (TEM) and High-Resolution TEM (HRTEM):

TEM images were taken on a JEOL X-100 electron microscope using a 100 kV accelerating voltage. High resolution TEM images were taken on Fei Titan 80-300 microscope with an accelerating voltage of 300 kV. The urified CdSe nanocrystals having 1-dimensional quantum confinement were dispersed into toluene or hexanes solution, then several drops of the solution were added onto a Formvar-coated or carbon film copper grid, and the grid with the nanocrystals was dried in air.

Fourier Transform Infrared Spectroscopy (FTIR):

FTIR spectra were recorded on a Bruker Tensor 27 FT-IR spectrometer at room temperature by directly applying sample onto a KBr salt plate.

X-Ray Powder Diffraction (XRD):

XRD patterns were acquired using Philips PW1830 X-ray diffractometer operating at 45 kV/40 mA and Rigaku Mini-Flex X-ray diffractometer operating at 30 kV/15 mA.

Energy-Dispersive X-Ray Spectroscopy (EDX):

EDX was used for elemental analysis using a Philips ESEM XL30 scanning electron microscope equipped with a field emission gun and operated at 30 kV.

X-Ray Photoelectron Spectroscopy (XPS):

XPS spectra were obtained on PHI 5000 VersaProbe instrument.

EXAMPLE 2

Synthesis and Characterization of CdS Nanocrystals Having 1-Dimensional Quantum Confinement Materials:

Cadmium acetate dihydrate (99.999%, Alfa), melissic acid (TCI), myristic acid (98%, Alfa), oleic acid (90%, Aldrich), oleylamine (80-90%, Aldrich), stearic acid (90%, Alfa), sulfur (99.5%, Alfa), 1-octadecene (90%, ODE, Alfa), tributylphosphine (95%, TBP, Alfa), CdS (Aldrich), erythrosin B (Alfa), stilbene 420 (Exciton), coumarin 545 (Exciton), chloroform (EM Science), ethanol (EtOH, Pharmco), hexanes (EM Science), methanol (EM Science), toluene (Mallinchrodt) were used without further purification.

Synthesis of CdS Nanocrystal Discs:

S in ODE solution was prepared by dissolving 0.0320 g Sulfur (1.0 mmol) in 20 g ODE by gentle sonication and stored in closed vial for use. Except the thinnest one with oleylamine added as the activation reagent for S at a relatively low reaction temperature (see below), the other three thicknesses could all be synthesized with cadmium acetate dihydrate, sulfur, fatty acids, and ODE as the starting materials. Among all fatty acids tested, myristic acid and stearic acid could only yield disks with two thinner ones, oleic acid worked for three thin ones but not the thickest one, and melissic acid was the only ligand which could yield all four types of disks. Considering the cost of fatty acids, typical synthesis for a specific thickness would be mostly with less expensive oleic acid as the ligands.

CdS Nanocrystal Discs—328 nm First Absorption Peak

Cadmium acetate dihydrate (0.0533 g, 0.20 mmol), S in ODE solution (1.0016 g, 0.05 mmol S) prepared using the method described above, oleic acid (0.0565 g, 0.20 mmol), oleylamine (0.05 g, 0.19 mmol), and 2.95 g ODE was bubbled with Ar for 10 minutes, then heated to 170° C. in 9 minutes from room temperature under Ar flow, and kept under 170° C. for 5 minutes, small aliquots were taken out at different time intervals, diluted in chloroform and measured by UV-Vis to monitor the reaction.

CdS Nanocrystal Discs—374 nm First Absorption Peak cadmium acetate dihydrate (0.0533 g, 0.20 mmol), S in ODE solution (1.0016 g, 0.05 mmol S), myristic acid (0.0457 g, 0.20 mmol), and 3.0 g ODE was bubbled with Ar for 10 minutes, then heated to 180° C. in 8 minutes from room temperature under Ar flow, and kept under 180° C. for 30 minutes, small aliquots were taken out at different time intervals, diluted in toluene and measured by UV-Vis to monitor the reaction.

CdS Nanocrystal Discs—407 nm First Absorption Peak

Cadmium acetate dihydrate (0.0533 g, 0.20 mmol), S in ODE solution (1.0016 g, 0.05 mmol S), oleic acid (0.0565 g, 0.20 mmol), and 3.0 g ODE was bubbled with Ar for 10 minutes, then heated to 260° C. in 15 minutes from room temperature under Ar flow, and kept under 260° C. for 1 minute, small aliquots were taken out at different time intervals, diluted in toluene and measured by UV-Vis to monitor the reaction.

CdS Nanocrystal Discs—431 nm First Absorption Peak

Cadmium acetate dihydrate (0.0533 g, 0.20 mmol), S in ODE solution (1.0016 g, 0.05 mmol S), melissic acid (0.0226 g, 0.05 mmol), and 3.0 g ODE was bubbled with Ar for 10 minutes, then heated to 250° C. in 14 minutes from room temperature under Ar flow, and kept under 250° C. for 15 minutes, small aliquots were taken out at different time intervals, diluted in toluene and measured by UV-Vis to monitor the reaction. Caution: Special care needed to be paid for the synthesis apparatus airtightness to avoid the possible formation of cadmium oxide for this specific reaction because of its relatively low fatty acid concentration.

CdS Nanocrystal Discs—Injection Synthesis

Figure 13:
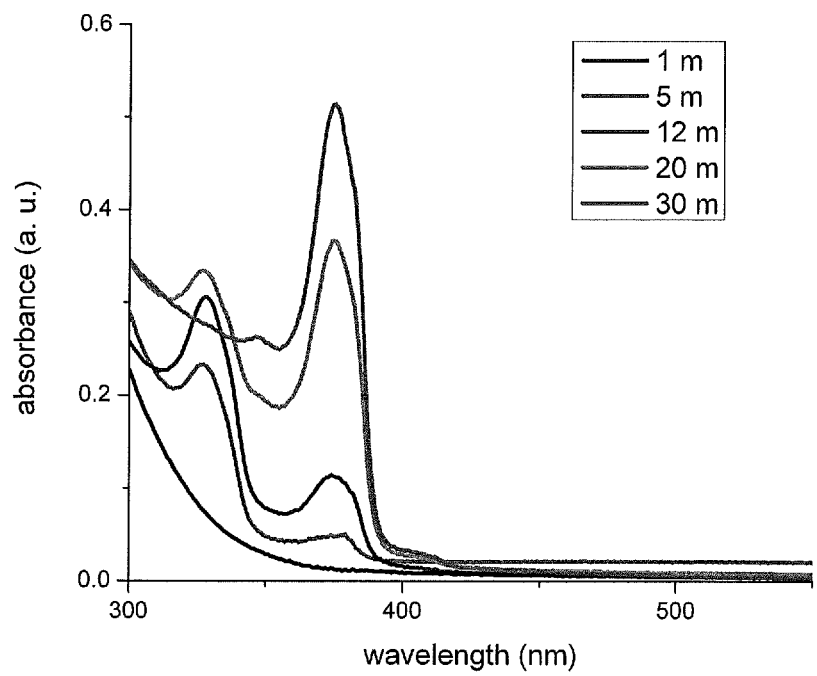
FIG. 13 provides UV-Vis absorption spectra illustrating the temporal evolution of the CdS nanocrystal discs according to one embodiment described herein.

Reaction was carried out with the injection of 0.05 mmol S in 1 g ODE into 0.20 mmol cadmium acetate dehydrate, 0.20 mmol myristic acid and 3 g ODE at 190° C. After injection the reaction temperature was kept at 180° C. for 30 minutes. FIG. 13 provides UV-Vis absorption spectra illustrating the temporal evolution of the CdS nanocrystal discs.

Purification of CdS Nanocrystal Discs for Different Measurements:

For TEM measurements, purification of CdS quantum disks was generally carried out by following procedure. TBP and EtOH mixture (10% volume ratio of TBP) was added into the final products, sonicated, then centrifugated at 4,000 RPM for 5 minutes. The precipitate was preserved, and repeated for another 2 times. Purified samples were dissolved into toluene or hexanes forming clear solution.

Purification of CdS quantum disks for XRD and EDX characterization was similar with the aforementioned procedure except that centrifugation was carried out at 3,000 RPM for 15 minutes. In addition, EtOH was used to wash the precipitate one more time and the final precipitate was preserved and dried in vacuum oven overnight before grinding in mortar for XRD analysis or applied to the conducting tape for EDX analysis.

Optical Measurements:

UV-vis spectra were taken on an HP 8453 UV-visible spectrophotometer. Photoluminescence spectra were measured using a Spex Fluorolog-3 fluorometer. The quantum yield data reported in this work were obtained using stilbene 420 in methanol (95%), coumarin 545 in EtOH (90%) as the standard.

Time-resolved photoluminescence (TRPL) on the picosecond scale were performed by using a Ti: sapphire mode-locked laser delivering 3 ps pulses at 76 MHz repetition rate with the samples dissolved in toluene at room temperature. The excitation wavelength was tuned to 375 nm which was provided by a second harmonic generator (1 mm thick beta barium borate). The luminescence was dispersed by a 0.24 m single monochromator coupled with a Streak Camera (Hamamatsu) operating in synchron scan mode, equipped with a two-dimensional charge-coupled device. The system provided an overall time resolution of about 15 ps and an energy resolution of about 1 meV. The nanosecond time-resolved emission decay of the CdS quantum dot solution was measured using a FLS 920 photocounting system (Edinburgh Instruments Ltd., UK) at room temperature. The excitation light source was a 405 nm pump laser at 2 MHz.

Transmission Electron Microscopy (TEM) and High-Resolution TEM (HRTEM):

TEM and HRTEM images were taken on FEI Titan 80-300 microscope with an accelerating voltage of 300 kV. Purified CdS quantum disks were dispersed into toluene or hexanes, then several drops of the solution were added onto a carbon coated copper grid and the grid with the nanocrystals was dried in air.

X-Ray Powder Diffraction (XRD):

XRD patterns were acquired using Rigaku MiniFlex II X-ray diffractometer operating at 30 kV/15 mA.

Energy-Dispersive X-Ray Spectroscopy (EDX):

EDX was used for elemental analysis using a Philips ESEM XL30 scanning electron microscope equipped with a field emission gun and operated at 30 kV.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A nanocrystal comprising:
a semiconductor material MX, wherein M is a group II element or a group III element and X is a group V or a group VI element to provide a II/VI compound or a III/V compound, the nanocrystal having lateral dimensions and a vertical dimension having the shortest axis, wherein surfaces of the nanocrystal substantially normal to the axis of the vertical dimension comprise a layer of M ions passivated by a counter ion chemical species, and wherein the vertical dimension comprises a non-integer number of monolayers of the semiconductor material.

2. The nanocrystal of claim 1, wherein the non-integer number is half a monolayer more than an integer number.

3. The nanocrystal of claim 2, wherein the vertical dimension comprises 4.5 monolayers, 5.5 monolayers, 6.5 monolayers or 7.5 monolayers of the semiconductor material.

4. The nanocrystal of claim 1, wherein the surfaces substantially normal to the axis of the vertical dimension are basal surfaces of the nanocrystal.

5. The nanocrystal of claim 4, wherein the basal surfaces are substantially atomically flat.

6. The nanocrystal of claim 1, wherein surfaces of the nanocrystal non-normal to the axis of the vertical dimension comprise M ions passivated by the counter ion chemical species.

7. The nanocrystal of claim 1, wherein the counter ion chemical species comprises one or more carboxylate ligands.

8. The nanocrystal of claim 7, wherein the carboxylate ligands comprise one or more species of fatty acid carboxylates.

9. The nanocrystal of claim 8, wherein the fatty acid carboxylates comprise a branched hydrocarbon tail.

10. The nanocrystal of claim 1, wherein the counter ion chemical species comprises one or more phosphonate ligands or sulfonate ligands.

11. The nanocrystal of claim 10, wherein the phosphonate ligands comprises alkyl phosphonates, akenyl phosphonates or mixtures thereof.

12. The nanocrystal of claim 10, wherein the sulfonate ligands comprises alkyl sulfonates, akenyl sulfonates or mixtures thereof.

13. The nanocrystal of claim 1 having a cubic crystalline structure.

14. The nanocrystal of claim 13 wherein the cubic crystalline structure is a zinc blend crystalline structure.

15. The nanocrystal of claim 14, wherein the vertical dimension is the <001> or <111> crystallographic direction.

16. The nanocrystal of claim 13 having a lattice dilation of at least 1% as measured by one or more x-ray diffraction reflections of the lattice.

17. The nanocrystal of claim 1 having lateral dimensions ranging from about 15 nm to about 150 nm.

18. The nanocrystal of claim 1 having a photoluminescent lifetime less than 1 nanosecond.

19. The nanocrystal of claim 1, wherein M is cadmium and X is selected from the group consisting of sulfur, selenium and tellurium.

20. The nanocrystal of claim 1 having a square or rectangular disc shape.

21. A composition comprising:
colloidal nanocrystals comprising a semiconductor material MX, wherein M is a group II element or a group III element and X is a group V or a group VI element to provide a II/VI compound or a III/V compound, the nanocrystals having lateral dimensions and a vertical dimension having the shortest axis, wherein surfaces of the nanocrystals normal or substantially normal to the axis of the vertical dimension comprise a layer of M ions passivated by a counter ion chemical species, and wherein the vertical dimension of the colloidal nanocrystals comprises a non-integer number of monolayers of the semiconductor material.

22. The composition of claim 21, wherein the non-integer number is half a monolayer more than an integer number.

23. The composition of claim 21, wherein the colloidal semiconductor nanocrystals are substantially monodisperse in at least one of the lateral dimensions.

24. The composition of claim 21, wherein the colloidal semiconductor nanocrystals are substantially monodisperse in the lateral dimensions.

25. The composition of claim 21, wherein the colloidal semiconductor nanocrystals have a photoluminescent lifetime less than 1 nanosecond.

26. The composition of claim 21, wherein the colloidal semiconductor nanocrystals have a photoluminescent lifetime less than 200 picoseconds.

27. The composition of claim 23, wherein the colloidal semiconductor nanocrystals have a photoluminescent quantum yield of at least about 30%.

28. A method of synthesizing colloidal semiconductor nanocrystals of the formula MX comprising:
adding to a reaction vessel a cation precursor (M) comprising a metal salt;
adding to the reaction vessel one or more fatty acid species to provide a mixture comprising the cation precursor and the one or more fatty acid species;
adding an anion precursor (X) to the reaction vessel; and
heating the mixture to a reaction temperature sufficient to form the colloidal semiconductor nanocrystals having lateral dimensions and a vertical dimension having the shortest axis, wherein surfaces of the nanocrystal normal or substantially normal to the axis of the vertical dimension comprise a layer of M ions passivated by counter ion chemical species, wherein the vertical dimension of the colloidal nanocrystals comprises a non-integer number of monolayers of the semiconductor material, wherein MX is a II/VI compound or a III/V compound, and wherein the anion precursor (X) is added to the reaction vessel prior to the mixture reaching the reaction temperature.

29. The method of claim 28, wherein the colloidal semiconductor nanocrystals are substantially monodisperse in at least one of the lateral dimensions.

30. The method of claim 28 further comprising purifying the colloidal nanocrystals, wherein purifying comprises contacting the colloidal nanocrystals with a mixture comprising one or more organophosphines and one or more alcohols to provide a purification mixture.

31. A method of synthesizing colloidal semiconductor nanocrystals of the formula MX comprising a vertical dimension (z) in a first predetermined size range, a first lateral dimension (x) in a second predetermined size range and a second lateral dimension (y) in a third predetermined size range comprising
adding to a reaction vessel a cation precursor (M) comprising a metal salt,
adding to the reaction vessel one or more fatty acid species to provide a mixture comprising the cation precursor and the one or more fatty acid species;
adding to the reaction vessel an anion precursor (X);
heating the mixture to a reaction temperature sufficient to provide the semiconductor nanocrystals (MX) the vertical dimension (z) in the first predetermined size range;
stabilizing the semiconductor nanocrystals at the reaction temperature with the one or more fatty acid species; and
maintaining the semiconductor nanocrystals at the reaction temperature for a time period sufficient to provide the semiconductor nanocrystals the first lateral dimension (x) in the second predetermined size range and the second lateral dimension (y) in the third predetermined size range, wherein the vertical dimension is the shortest dimension of the colloidal semiconductor nanocrystals, wherein the vertical dimension of the colloidal nanocrystals comprises a non-integer number of monolayers of the semiconductor material, wherein MX is a II/VI compound or a III/V compound, and wherein the anion precursor (X) is added to the reaction vessel prior to the mixture reaching the reaction temperature.

* * * * *